(12) United States Patent
Hagleitner

(10) Patent No.: US 9,640,623 B2
(45) Date of Patent: May 2, 2017

(54) SEMICONDUCTOR DEVICE WITH IMPROVED FIELD PLATE

(71) Applicant: Cree, Inc., Durham, NC (US)

(72) Inventor: Helmut Hagleitner, Zebulon, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 14/517,185

(22) Filed: Oct. 17, 2014

(65) Prior Publication Data

US 2016/0111502 A1    Apr. 21, 2016

(51) Int. Cl.
| | |
|---|---|
| *H01L 29/40* | (2006.01) |
| *H01L 29/78* | (2006.01) |
| *H01L 29/66* | (2006.01) |
| *H01L 29/49* | (2006.01) |
| *H01L 29/778* | (2006.01) |
| *H01L 29/812* | (2006.01) |
| *H01L 29/417* | (2006.01) |
| *H01L 29/16* | (2006.01) |
| *H01L 29/20* | (2006.01) |

(52) U.S. Cl.
CPC ........ *H01L 29/402* (2013.01); *H01L 29/4958* (2013.01); *H01L 29/66068* (2013.01); *H01L 29/66462* (2013.01); *H01L 29/66568* (2013.01); *H01L 29/66863* (2013.01); *H01L 29/7786* (2013.01); *H01L 29/78* (2013.01); *H01L 29/8128* (2013.01); *H01L 29/1608* (2013.01); *H01L 29/2003* (2013.01); *H01L 29/41766* (2013.01)

(58) Field of Classification Search
CPC ............. H01L 29/66795; H01L 29/785; H01L 29/0649; H01L 29/2003; H01L 29/0847

USPC .................................................. 257/192, 194
See application file for complete search history.

(56) References Cited

U.S. PATENT DOCUMENTS

| | | | |
|---|---|---|---|
| 7,501,669 B2 | 3/2009 | Parikh et al. | |
| 7,573,078 B2 | 8/2009 | Wu et al. | |
| 7,893,500 B2* | 2/2011 | Wu | H01L 29/2003 257/194 |
| 8,198,178 B2 | 6/2012 | Heikman et al. | |
| 8,563,372 B2 | 10/2013 | Hagleitner et al. | |
| 2004/0262685 A1* | 12/2004 | Zingg | H01L 29/7824 257/347 |

(Continued)

OTHER PUBLICATIONS

Radivojevic, Z. et al., "Electromigration Lifetime Prediction of RF-PA Transistors," 24th International Conference on Microelectronics, vol. 2, May 16-19, 2004, IEEE, pp. 685-688.

*Primary Examiner* — Andy Huynh
(74) *Attorney, Agent, or Firm* — Myers Bigel, P.A.

(57) ABSTRACT

A transistor device includes a semiconductor body, a spacer layer, and a field plate. The spacer layer is over at least a portion of a surface of the semiconductor body. The field plate is over at least a portion of the spacer layer, and includes a semiconductor layer between a first refractory metal interposer layer and a second refractory metal interposer layer. By including the semiconductor layer between the first refractory metal interposer layer and the second refractory metal interposer layer, the electromigration of metals in the field plate is significantly reduced. Since electromigration of metals in the field plate is a common cause of transistor device failures, reducing the electromigration of metals in the field plate improves the reliability and lifetime of the transistor device.

23 Claims, 23 Drawing Sheets

(56) References Cited

U.S. PATENT DOCUMENTS

| | | | |
|---|---|---|---|
| 2007/0235775 A1* | 10/2007 | Wu | H01L 29/404 |
| | | | 257/288 |
| 2011/0169054 A1 | 7/2011 | Wu | |
| 2012/0217544 A1* | 8/2012 | Ohki | H01L 29/402 |
| | | | 257/194 |
| 2015/0144953 A1* | 5/2015 | Hill | H01L 29/402 |
| | | | 257/76 |
| 2016/0111502 A1 | 4/2016 | Hagleitner | |

* cited by examiner

SEMICONDUCTOR DEVICE WITH IMPROVED FIELD PLATE

FIELD OF THE DISCLOSURE

The present disclosure relates to transistor devices including field plates. Specifically, the present disclosure relates to transistor devices including field plates with reduced electromigration characteristics.

BACKGROUND

Wide bandgap transistor devices are being used with increasing frequency due to their performance advantages in high power, high temperature, and high frequency applications. While the advantages of wide bandgap transistor devices are well known, wide bandgap materials systems have been slow to replace their conventional counterparts due to challenges encountered in the design and manufacture of wide bandgap devices. One specific challenge facing many wide bandgap transistor devices used in high frequency applications is reduced performance due to a capacitance between two or more electrodes of the device. For example, in the case of field-effect devices and high electron mobility transistors (HEMTs), capacitive coupling between a gate electrode and a drain electrode reduces both the gain and breakdown voltage of the device.

In recent years, field plates have gained traction as a means for mitigating the negative effects of undesirable capacitances between electrodes of wide bandgap transistor devices. A field plate is a conductive plate that is placed over a portion of a charge transport layer between two electrodes in the transistor device such that the field plate is electrically isolated from the charge transport layer and the electrodes. Generally, field plates are used in field-effect devices and thus are placed between a gate and a drain electrode of the device, however, many different transistor devices may benefit from the use of field plates. The field plate reduces the capacitance between the gate and drain electrodes and redistributes an electric field on the drain side of the device in order to improve the break down voltage, gain, and maximum operating frequency of the device.

While field plates have allowed wide bandgap transistor devices to achieve performance metrics that were previously unheard of, many field plates continue to suffer from relatively high electromigration of one or more conductive materials within the field plate. Electromigration is the movement or transport of material due to a transfer of momentum between conducting electrons and one or more atoms in the migrating material. In other words, electromigration is the physical movement of a material over time due to a current flowing through the material. In the case of field plates, electromigration may cause undesirable connections between the field plate and an electrode or charge transport layer due to the migration of conductive material from the field plate through one or more spacer layers. Additionally, electromigration may cause disconnection of a desired connection between the field plate and one or more electrodes or voltage sources due to the migration of conductive material away from the desired connection points. Accordingly, electromigration of the field plate may cause the field plate to cease functioning, reduced performance of the transistor device, and even complete failure of the transistor device.

In light of the discussion above, there is a present need for field plates with reduced electromigration characteristics and methods for manufacturing the same.

SUMMARY

The present disclosure relates to transistor devices including field plates with reduced electromigration characteristics. In one embodiment, a transistor device includes a semiconductor body, a spacer layer, and a field plate. The spacer layer is over at least a portion of a surface of the semiconductor body. The field plate is over at least a portion of the spacer layer, and includes a semiconductor layer between a first refractory metal interposer layer and a second refractory metal interposer layer. By including the semiconductor layer between the first refractory metal interposer layer and the second refractory metal interposer layer, the electromigration of metals in the field plate is significantly reduced. Since electromigration of metals in the field plate is a common cause of transistor device failures, reducing the electromigration of metals in the field plate improves the reliability and lifetime of the transistor device.

In one embodiment, the field plate further includes a first adhesion layer on the surface of the spacer layer opposite the semiconductor body, a third refractory metal interposer layer over the first adhesion layer, a second adhesion layer between the third refractory metal interposer layer and the first refractory metal interposer layer, and a protective overlayer over the second refractory metal layer. In various embodiments, the first adhesion layer may be between 50 Å and 150 Å thick, the third refractory metal interposer layer may be between 100 Å and 300 Å thick, the second adhesion layer may be between 75 Å and 150 Å thick, the first refractory metal interposer layer may be between 75 Å and 150 Å thick, the semiconductor layer may be between 350 Å and 450 Å thick, the second refractory metal interposer layer may be between 75 Å and 150 Å thick, and the protective overlayer may be between 75 Å and 125 Å thick.

In one embodiment, the field plate further includes a first adhesion layer between the surface of the spacer layer opposite the semiconductor body and the first refractory metal interposer layer, and a protective overlayer over the second refractory metal interposer layer.

In one embodiment, the first refractory metal interposer layer, the second refractory interposer layer, and the third refractory interposer layer may be respective layers of nickel. The first refractory metal interposer layer, the second refractory interposer layer, and the third refractory metal interposer layer may be deposited via physical vapor deposition in various embodiments. The first adhesion layer may be titanium (Ti), the second adhesion layer may be platinum (Pt), the semiconductor layer may be silicon (Si), and the protective overlayer may be titanium (Ti).

In one embodiment, the transistor device also includes a source electrode, a drain electrode, and a gate, each in electrical contact with the semiconductor body, such that the gate is between the source electrode and the drain electrode. The spacer layer may be over at least a portion of the gate, and the field plate may be positioned on the spacer layer such that a portion of the field plate is over the gate. The field plate may also be electrically connected to the source electrode.

In one embodiment, a method of forming a transistor device includes the steps of providing a semiconductor body, providing a spacer layer over at least a portion of a surface of the semiconductor body, and providing a field plate over at least a portion of the spacer layer. Providing the field plate may include the steps of providing a first refractory metal interposer layer, providing a semiconductor layer over the first refractory metal interposer layer, and providing a second refractory metal interposer layer over the semiconductor layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
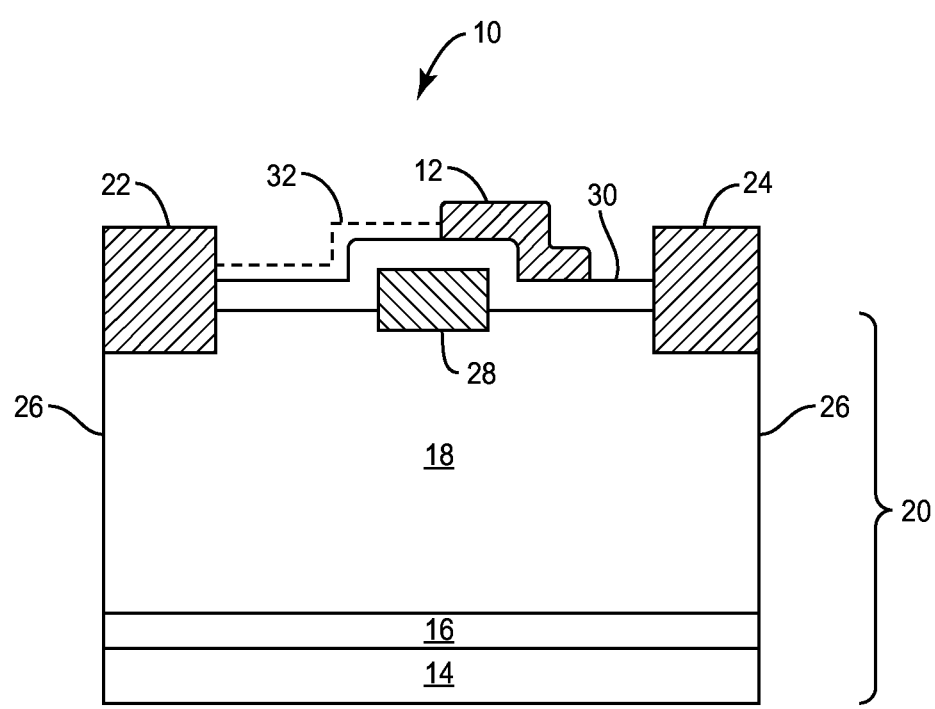
FIG. 1 illustrates a field effect transistor including a field plate according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
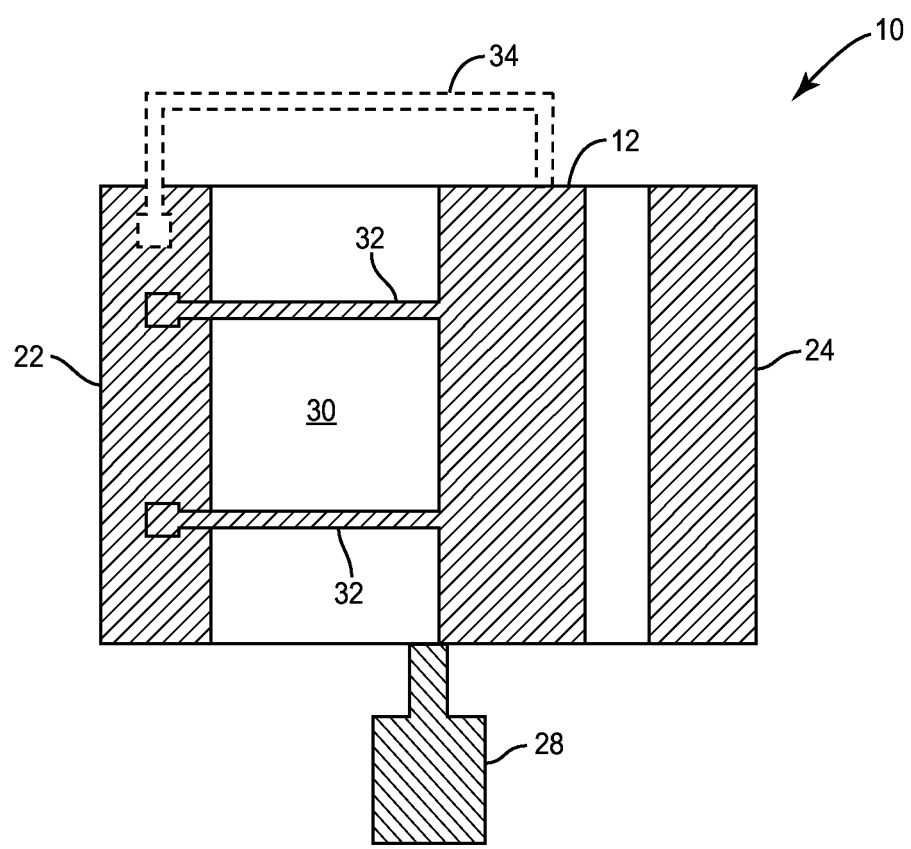
FIG. 2 shows a plan view of the field effect transistor and field plate shown in FIG. 1 according to one embodiment of the present disclosure.

FIGS. 1 and 2 show a transistor device 10 including a field plate 12 according to one embodiment of the present disclosure. Specifically, FIG. 1 shows an embodiment wherein the transistor device 10 is a metal-semiconductor field-effect transistor (MESFET) including a substrate 14, a buffer layer 16 over the substrate 14, and a channel layer 18 over the buffer layer 16. Collectively, the substrate 14, the buffer layer 16, the channel layer 18, and any additional semiconductor layers of the transistor device 10 are referred to as a semiconductor body 20. A source electrode 22 and a drain electrode 24 are each embedded in the channel layer 18 on opposite lateral edges 26 of the transistor device 10, and a gate 28 is in electrical contact with the channel layer 18 between the source electrode 22 and the drain electrode 24. A spacer layer 30 is over the gate 28 and the exposed portions of the channel layer 18 opposite the buffer layer 16 and the substrate 14. Although the spacer layer 30 is shown covering the entirety of the gate 28 and the exposed portions of the channel layer 18 between the source electrode 22 and the drain electrode 24, the spacer layer 30 may cover less area so long as the spacer layer 30 is sufficient to support and isolate the field plate 12 from the gate 28 and the channel layer 18. The field plate 12 is over the spacer layer 30 such that the field plate 12 partially overlaps the gate 28 and the channel layer 18 near the drain electrode 24 without electrically contacting either. In one embodiment, the field plate 12 extends between 0.1 to 2 microns from the edge of the gate 28 towards the drain electrode 24. A passivation layer (not shown) may be provided over the source electrode 22, the drain electrode 24, the spacer layer 30, any exposed portions of the channel layer 18 and/or gate 28, and the field plate 12.

The field plate 12 may include one or more conductive paths 32 to the source electrode 22. Generally, the conductive paths 32 are also on top of the spacer layer 30 such that they are electrically isolated from the gate 28 and the channel layer 18. Different sizes and numbers of conductive paths 32 may be used in various embodiments. However, as the combined area of the conductive paths 32 increases, so does the parasitic capacitance between the structures. Accordingly, a balance between the desired conductivity of the conductive paths 32 and the parasitic capacitance thereof should be struck. The spacer layer 30 may individually run under each one of the conductive paths 32 or may be provided underneath the entire area of the conductive paths 32. In one embodiment, a separate conductive path 34 may be formed that runs outside of the active region of the transistor device 10, as shown in FIG. 2. For example, when the spacer layer 30 is not present over the portion of the channel layer 18 between the source electrode 22 and the gate 28, the separate conductive path 34 may be provided as shown.

The substrate 14 may be between 200 microns and 700 microns thick, and may be formed from any material suitable for supporting growth of a desired semiconductor material for the buffer layer 16 and the channel layer 18. The buffer layer 16 may be between 0.1 microns and 2 microns thick, and may be formed from a wide bandgap material such as silicon carbide (SiC), gallium nitride (GaN), gallium arsenide (GaAs), or the like. The channel layer 18 may be between 25 nm and 1 micron thick, and may additionally be formed from any suitable wide bandgap semiconductor material. In one embodiment, a nucleation layer (not shown) may be included between the substrate 14 and the buffer layer 16 in order to reduce any lattice mismatch between the two. The spacer layer 30 may be between 0.05 microns and 2.0 microns thick, and may be formed of any suitable material. For example, the spacer layer 30 may be a dielectric material such as silicon nitride (SiN), silicon oxide ($SiO_2$), silicon (Si), germanium (Ge), magnesium oxide ($MgO_x$), magnesium nitride ($MgN_x$), zinc oxide (ZnO), or the like. In other embodiments, the spacer layer 30 may be formed of alloys or layer sequences of any of the above mentioned materials.

The source electrode 22 and the drain electrode 24 may be formed of several different materials such as titanium, titanium alloys, aluminum, gold, nickel, platinum, chromium, tungsten, platinum, silicide, as well as combinations and alloys of the above. The gate 28 may similarly be formed of several different metals or alloys, and may have a gate length $L_G$ between 0.3 microns and 0.8 microns. As discussed above, many transistor devices including field plates suffer from reliability issues due to electromigration of metals in the field plate. Accordingly, the field plate 12 includes at least two current carrying layers that are separated by a refractory metal interposer layer, as discussed in further detail below. The refractory metal interposer layer effectively reduces the electromigration potential of the field plate 12, thereby preventing movement of metals in the field plate 12 over time and thus increasing the reliability of the transistor device 10. In various embodiments, the same metal structure used for the field plate 12 is similarly used for the source electrode 22, the drain electrode 24, and/or the gate 28 in order to reduce the electromigration characteristics thereof. However, decreasing the electromigration potential generally comes at the expense of added resistance, and therefore may not be suitable for the source electrode 22, the drain electrode 24, and/or the gate 28 in all circumstances.

In operation, a first biasing voltage is applied between the source electrode 22 and the drain electrode 24, and a second biasing voltage is applied between the source electrode 22 and the gate 28. The respective values of these biasing voltages determine the amount of current allowed to flow between the source electrode 22 and the drain electrode 24 of the device by varying the electric field present in the channel layer 18. As discussed above, a capacitance present between the drain electrode 24 and the gate 28 may produce undesirable effects in the transistor device 10. Often, the result is a more pronounced electric field at the drain side of the gate 28. Accordingly, the field plate 12 is provided to reduce the gate-to-drain capacitance and the electric field at the drain side of the gate 28. As a result, the transistor device 10 may operate at higher voltages and frequencies than its conventional counterparts.

Figure 3:
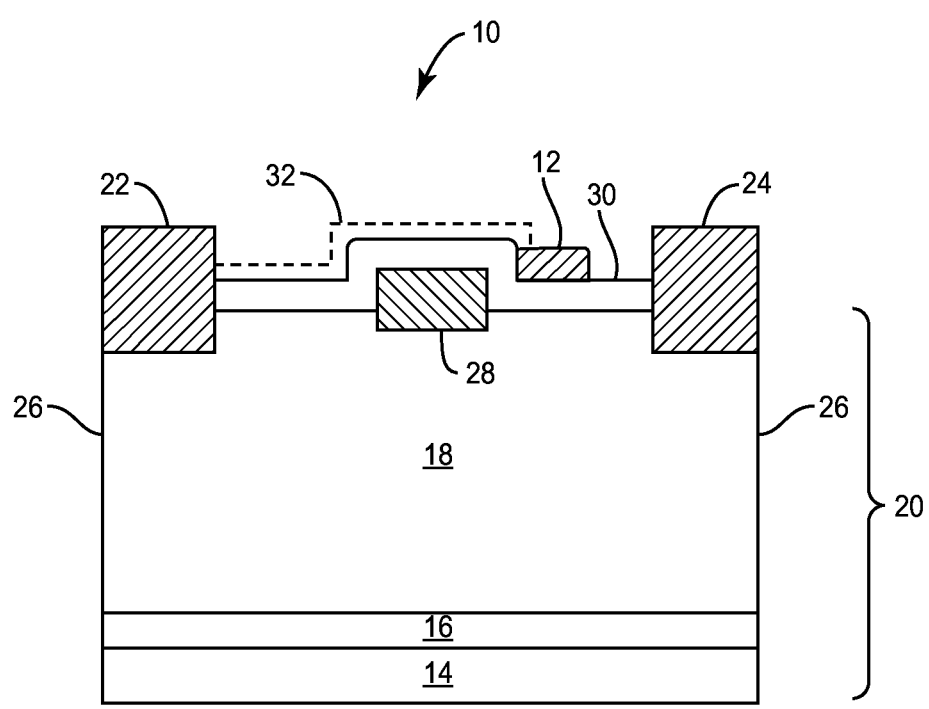
FIG. 3 illustrates a field effect transistor including a field plate according to an additional embodiment of the present disclosure.
Figure 4:
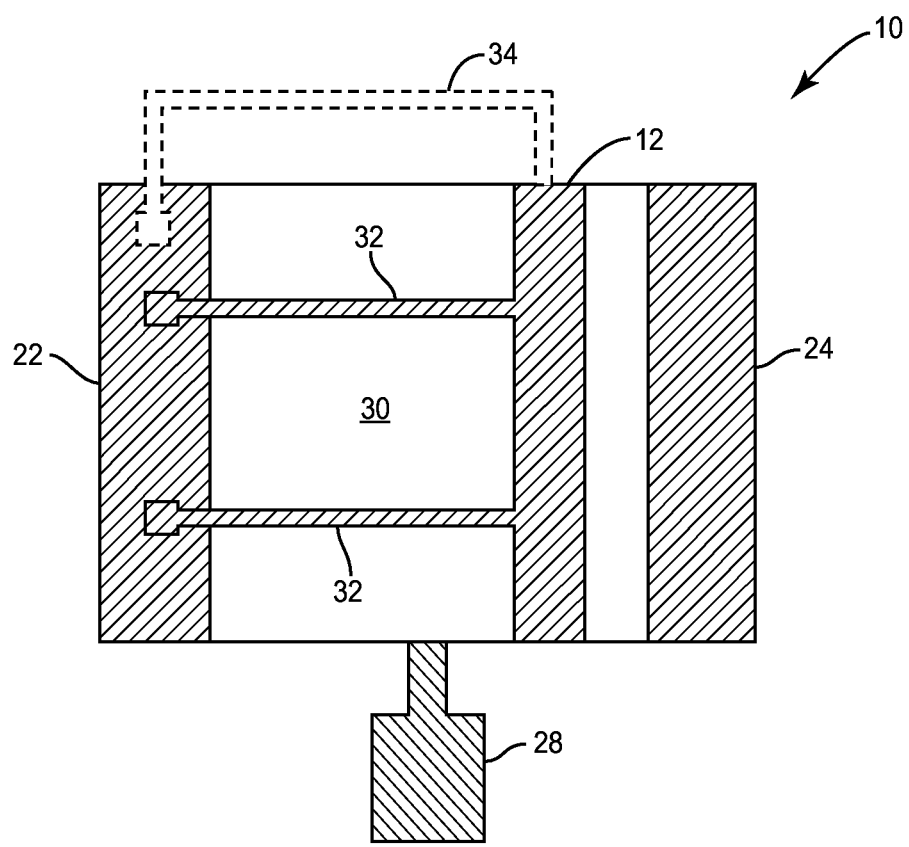
FIG. 4 shows a plan view of the field effect transistor and field plate shown in FIG. 3 according to one embodiment of the present disclosure.

FIGS. 3 and 4 show an additional embodiment wherein the transistor device 10 is a MESFET. The transistor device 10 shown in FIGS. 3 and 4 is substantially similar to that shown in FIGS. 1 and 2, except that the field plate 12 shown in FIGS. 3 and 4 does not overlap the gate 28, but rather is separated from the gate by some distance between the gate 28 and the drain electrode 24. Separating the field plate 12 from the gate 28 as shown may prevent an increase in the input capacitance (gate capacitance) of the transistor device 10 that may occur in the embodiment shown in FIGS. 1 and 2, while simultaneously reducing the capacitance between the gate 28 and the drain electrode 24. Accordingly, the field plate 12 shown in FIGS. 3 and 4 may be desirable in some applications wherein the input capacitance is an important design parameter.

Figure 5:
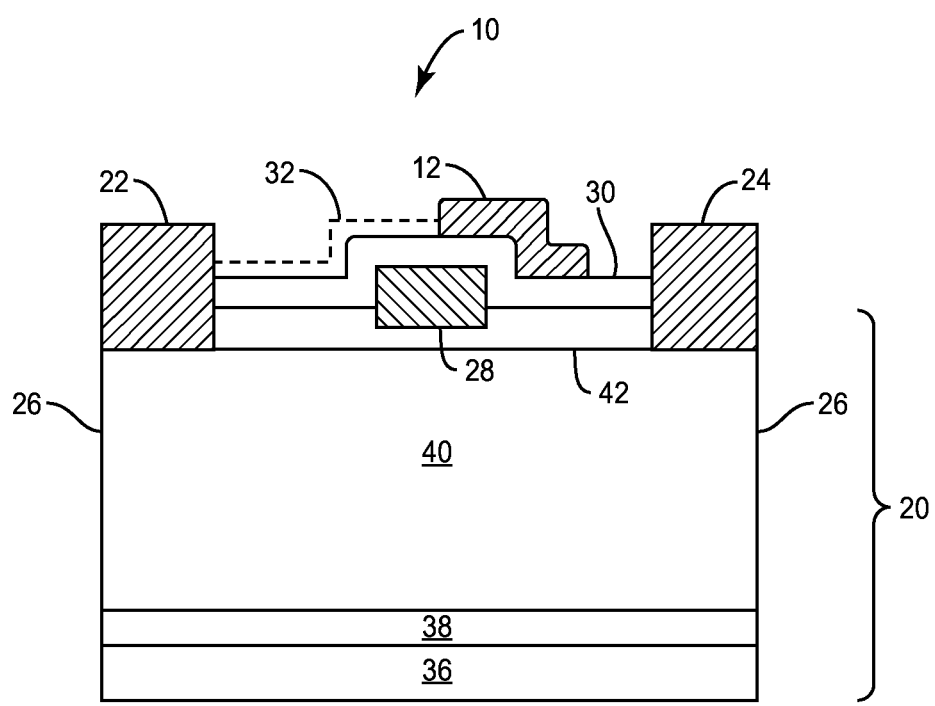
FIG. 5 illustrates a high electron mobility transistor including a field plate according to one embodiment of the present disclosure.
Figure 6:
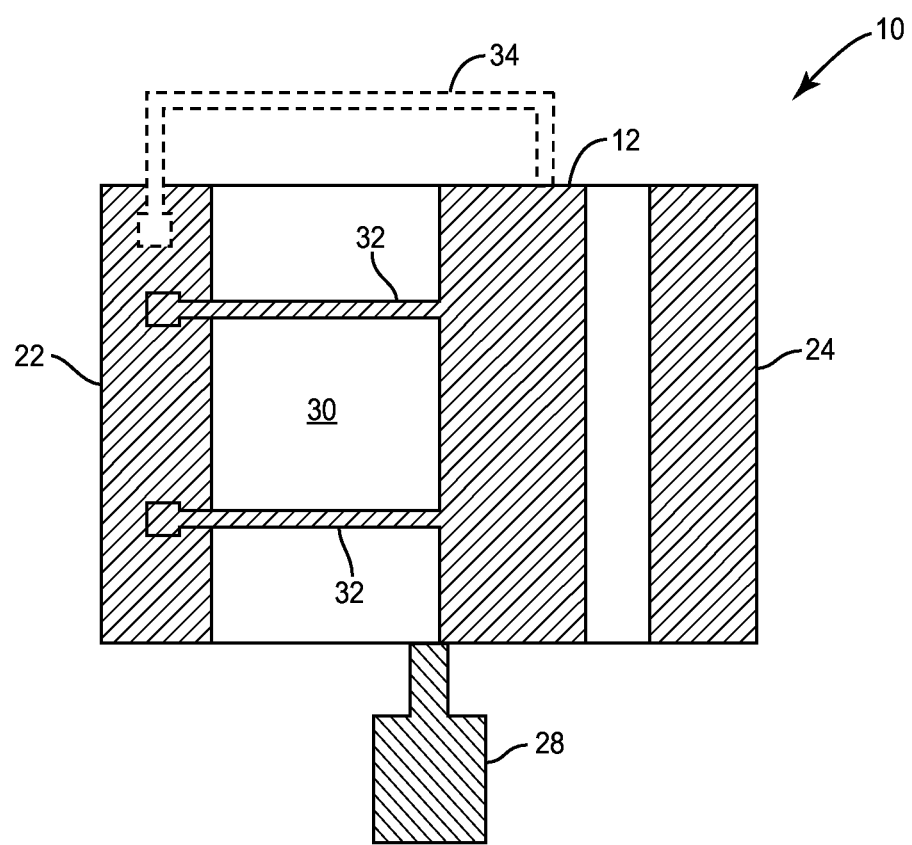
FIG. 6 shows a plan view of the high electron mobility transistor shown in FIG. 5 according to one embodiment of the present disclosure.

FIGS. 5 and 6 show an embodiment wherein the transistor device 10 is a high electron mobility transistor (HEMT). In the embodiment shown in FIGS. 5 and 6, the semiconductor body 20 of the transistor device 10 includes a substrate 36, a nucleation layer 38 over the substrate 36, a buffer layer 40 over the nucleation layer 38, and a barrier layer 42 over the buffer layer 40. While not shown, additional layers may be included in the semiconductor body 20 of the transistor device 10 without departing from the principles described herein. The source electrode 22 and the drain electrode 24 may be embedded in the barrier layer 42 such that the source electrode 22 and the drain electrode 24 are in direct contact with the buffer layer 40. The gate 28 may be on top of the barrier layer 42 such that the barrier layer 42 separates the gate 28 from the buffer layer 40. The spacer layer 30 is over the gate 28 and the exposed portions of the semiconductor body 20 opposite the semiconductor body 20. Although the spacer layer 30 is shown covering the entirety of the gate 28 and the exposed portions of the semiconductor body 20 between the source electrode 22 and the drain electrode 24, the spacer layer 30 may cover less area so long as the spacer layer 30 is sufficient to support and isolate the field plate 12 from the gate 28 and the semiconductor body 20. In one embodiment, the field plate 12 extends between 0.1 to 2 microns from the edge of the gate 28 towards the drain electrode 24. A passivation layer (not shown) may be provided over the source electrode 22, the drain electrode 24, the spacer layer 30, any exposed portions of the semiconductor body 20 and/or gate 28, and the field plate 12.

The substrate 36 may be between 200 microns and 700 microns thick, and may be formed from any suitable material suitable for supporting growth of a desired semiconductor material for the nucleation layer 38, the buffer layer 40, and the barrier layer 42. The nucleation layer 38 may be between 500 Å and 1500 Å thick, and may be formed from aluminum gallium nitride (AlGaN). The buffer layer 40 may be between 0.5 μm to 3 μm thick, and may be formed from any Group III nitride material such as indium gallium nitride (InGaN), aluminum gallium nitride (AlGaN), aluminum nitride (AlN), or the like. In one embodiment, the buffer layer 40 is a 2 μm thick layer of gallium nitride (GaN) with part of the layer doped with iron (Fe). The barrier layer 42 may be between 50 Å and 400 Å thick, and may similarly be formed from a doped or undoped Group III nitride material. In one embodiment, the barrier layer 42 comprises 0.8 nm of aluminum nitride (AlN) and 22.5 nm of aluminum gallium nitride (AlGaN).

In operation, a first biasing voltage is applied between the source electrode 22 and the drain electrode 24, and second biasing voltage is applied between the source electrode 22 and the gate 28. The respective values of these biasing voltages determine the electron concentration in a two-dimensional electron gas formed between the heterojunction of the buffer layer 40 and the barrier layer 42. The higher the concentration of electrons in the two-dimensional electron gas, the lower the resistivity thereof and thus the more current that is allowed to flow between the source electrode 22 and the drain electrode 24. As discussed above, a capacitance present between the drain electrode 24 and the gate 28 may produce undesirable effects in the transistor device 10, resulting in a higher resistivity and thus lower source-to-drain current than would otherwise occur. Accordingly, the field plate 12 is provided to reduce the gate-to-drain capacitance and the electric field at the drain side of the gate 28. As a result, the transistor device 10 may operate at higher voltages and frequencies than its conventional counterparts.

Figure 7:
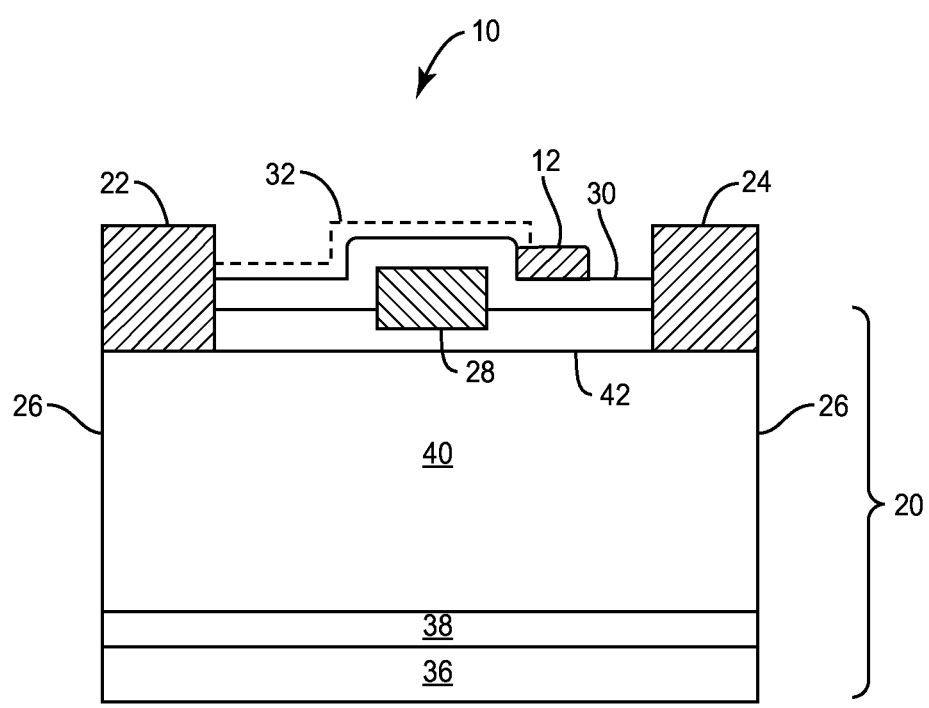
FIG. 7 illustrates a high electron mobility transistor including a field plate according to an additional embodiment of the present disclosure.
Figure 8:
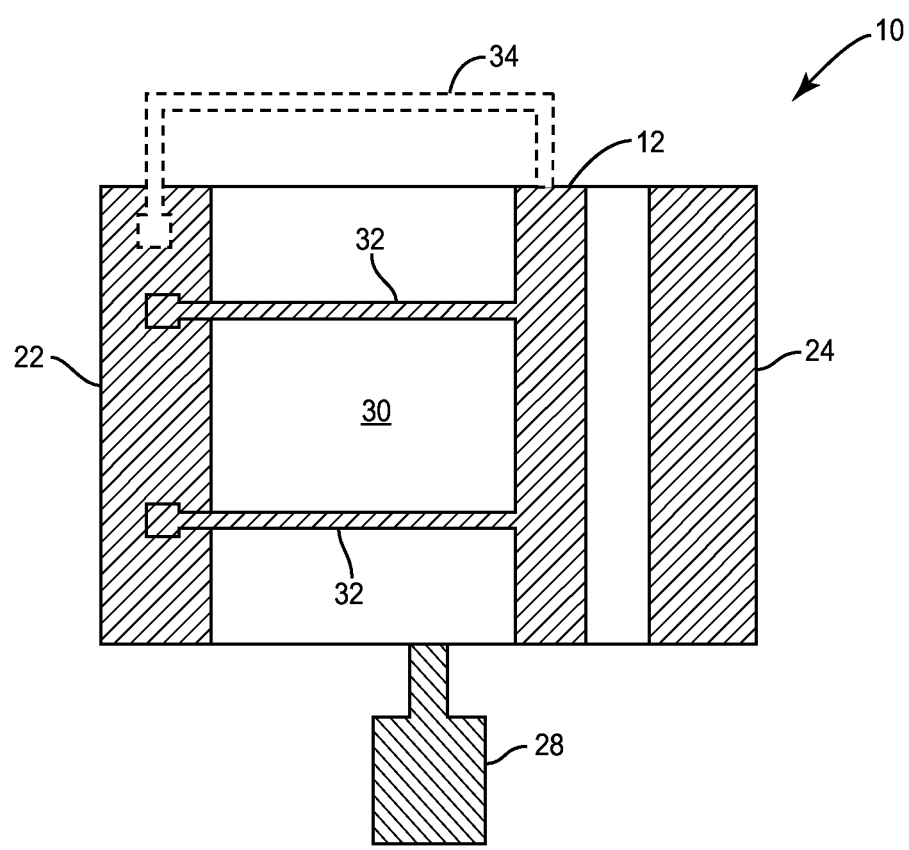
FIG. 8 shows a plan view of the high electron mobility transistor shown in FIG. 7 according to one embodiment of the present disclosure.

FIGS. 7 and 8 show an additional embodiment wherein the transistor device 10 is a HEMT. The transistor device shown in FIGS. 7 and 8 is substantially similar to that shown in FIGS. 5 and 6, except that the field plate 12 shown in FIGS. 7 and 8 does not overlap the gate 28, but rather is separated from the gate by some distance between the gate 28 and the drain electrode 24. Separating the field plate 12 from the gate 28 as shown may prevent an increase in the input capacitance (gate capacitance) of the transistor device 10 that may occur in the embodiment shown in FIGS. 5 and 6, while simultaneously reducing the capacitance between the gate 28 and the drain electrode 24. Accordingly, the field plate 12 shown in FIGS. 7 and 8 may be desirable in some applications wherein the input capacitance is an important design parameter.

Figure 9A:
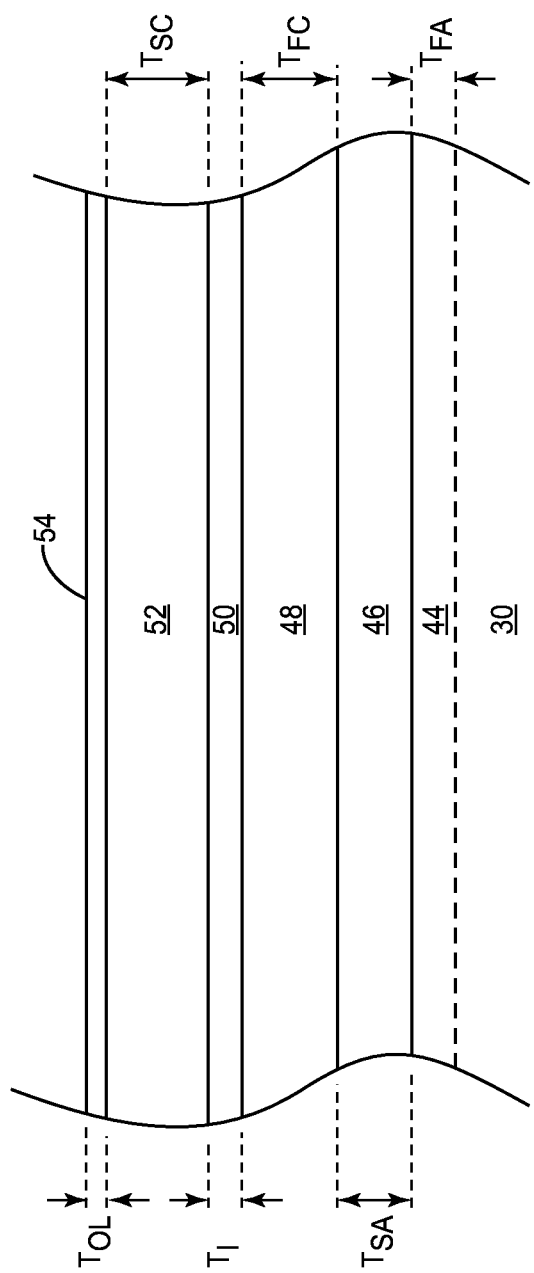
FIGS. 9A through 9E show details of the field plates shown in FIGS. 1 through 8 according to various embodiments of the present disclosure.

FIG. 9A shows details of the various layers of the field plate 12 according to one embodiment of the present disclosure. For context, the spacer layer 30 is also shown. The field plate 12 includes a first adhesion layer 44 on the surface of the spacer layer 30 opposite the channel layer 18, a second adhesion layer 46 over the first adhesion layer 44, a first current carrying layer 48 over the second adhesion layer 46, a refractory metal interposer layer 50 over the first current carrying layer 48, a second current carrying layer 52 over the refractory metal interposer layer 50, and a protective overlayer 54 over the second current carrying layer 52. The first adhesion layer 44 may have a thickness $T_{FA}$ between 150 Å and 250 Å. The second adhesion layer 46 may have a thickness $T_{SA}$ between 250 Å and 350 Å. The first current carrying layer 48 may have a thickness $T_{FC}$ between 2500 Å and 3500 Å. The refractory metal interposer layer 50 may have a thickness $T_I$ between 200 Å and 300 Å. The second current carrying layer 52 may have a thickness $T_{SC}$ between 2500 Å and 3500 Å. Finally, the protective overlayer 54 may have a thickness $T_{OL}$ between 25 Å and 75 Å.

In one embodiment, the first adhesion layer 44 is titanium (Ti). The second adhesion layer 46 may be platinum (Pt). The first current carrying layer 48 and the second current carrying layer 52 may be gold (Au). The protective overlayer 54 may be titanium (Ti) or platinum (Pt) in various embodiments. The refractory metal interposer layer 50 may be any refractory metal. For example, the refractory metal interposer layer 50 may be nickel (Ni), cobalt (Co), titanium (Ti), or combinations of multiple elements such as titanium-tungsten-nitride (TiWN). As discussed herein, refractory metals are metals that are resistant to both heat and wear. Because the refractory metal interposer layer 50 is resistant to both heat and wear, including the refractory metal interposer layer 50 in the field plate 12 reduces the electromigration of metals in the field plate 12. Accordingly, the reliability of the field plate 12 and thus the transistor device 10 is significantly improved. Specifically, by including the refractory metal interposer layer 50 in the field plate 12, the likelihood of disconnection and/or shorting of the field plate 12 is significantly reduced.

Although only a single refractory metal interposer layer 50 is shown in FIG. 9A, any number of refractory metal interposer layers 50 may be used without departing from the principles of the present disclosure. For example, an additional refractory metal interposer layer 50 may be included between the second current carrying layer 52 and the protective overlayer 54 in the field plate 12. While refractory metals are generally resistant to electromigration, such characteristics generally come at the expense of increased resistance. That is, there is a trade-off between resilience and resistance that should be considered in designing the field plate 12.

The primary purpose of the first adhesion layer 44, the second adhesion layer 46, and the protective overlayer 54 is to protect the first current carrying layer 48, the refractory metal interposer layer 50, and the second current carrying layer 52, as well as to provide adequate contact for these layers to the outside environment. In various embodiments, the first adhesion layer 44, the second adhesion layer 46, and the protective overlayer 54 may comprise any number of materials suitable for performing this task.

The first adhesion layer 44, the second adhesion layer 46, the first current carrying layer 48, the refractory metal interposer layer 50, the second current carrying layer 52, and the protective overlayer 54 may be deposited one on top of the other via any number of deposition processes. For example, the various layers may be deposited via a sputtering process, an evaporation process, or the like. In one embodiment, after the formation of some or all of the layers of the field plate 12, an annealing process is performed in which the field plate 12 is heated. The annealing process may cause one or more of the various layers of the field plate 12 to dissolve into one another or combine. The resulting combination of the layers is highly resistant to electromigration and therefore preserves the reliability of the transistor device 10 as discussed in detail above.

Figure 9B:
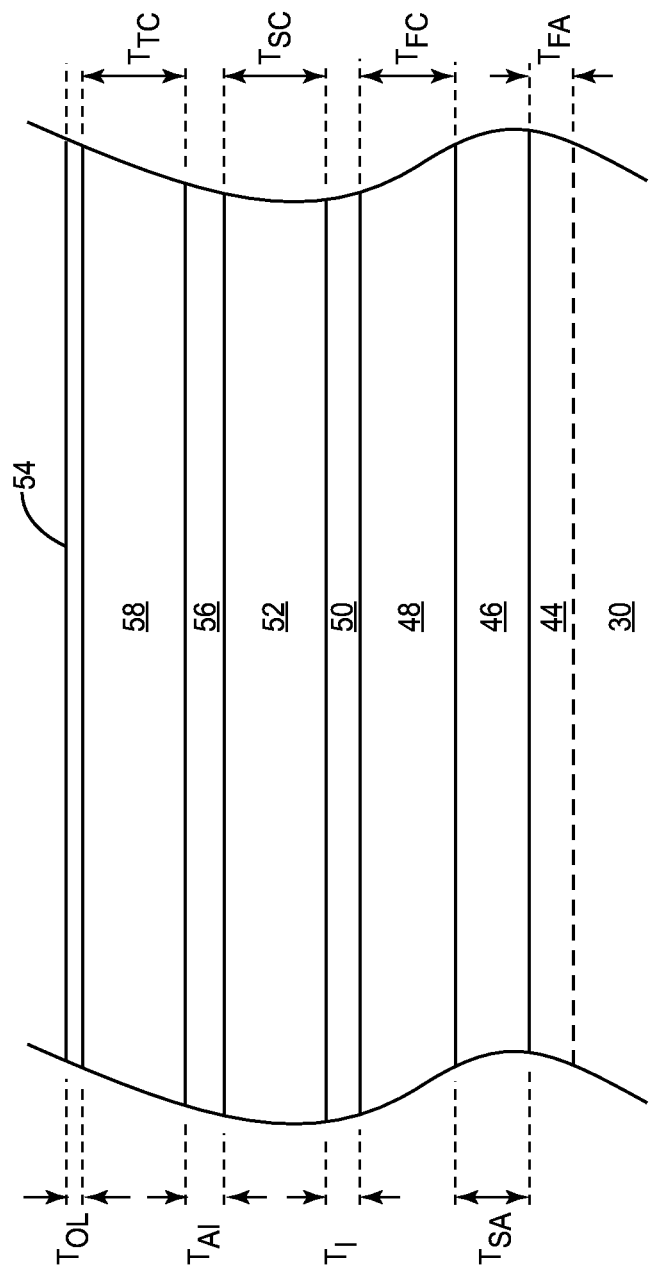

FIG. 9B shows details of the various layers of the field plate 12 according to an additional embodiment of the present disclosure. The field plate 12 shown in FIG. 9B is substantially similar to that shown in FIG. 9A, but further includes an additional refractory metal interposer layer 56 on top of the second current carrying layer 52 and a third current carrying layer 58 on top of the additional refractory metal interposer layer 56. Further, the thicknesses of the various layers may differ in the embodiment shown in FIG. 9B. For example, the first adhesion layer 44 may have a thickness $T_{FA}$ between 150 Å and 250 Å, the second adhesion layer 46 may have a thickness $T_{SA}$ between 250 Å and 250 Å, the first current carrying layer 48 may have a thickness $T_{FC}$ between 4500 Å and 5500 Å, the refractory metal interposer layer 50 may have a thickness $T_I$ between 150 Å and 250 Å, the second current carrying layer 52 may have a thickness $T_{SC}$ between 4500 Å and 5500 Å, the additional refractory metal interposer layer 56 may have a thickness $T_{AI}$ between 200 Å and 300 Å, the third current carrying layer 58 may have a thickness $T_{TC}$ between 4500 Å and 5500 Å, and the protective overlayer 54 may have a thickness $T_{OL}$ between 25 Å and 100 Å. The additional refractory metal interposer layer 56 may comprise the same materials as that of the refractory metal interposer layer 50 discussed above. Further, the third current carrying layer 58 may comprise any of the materials discussed above with respect to the first current carrying layer 48 and the second current carrying layer 52.

Figure 9C:
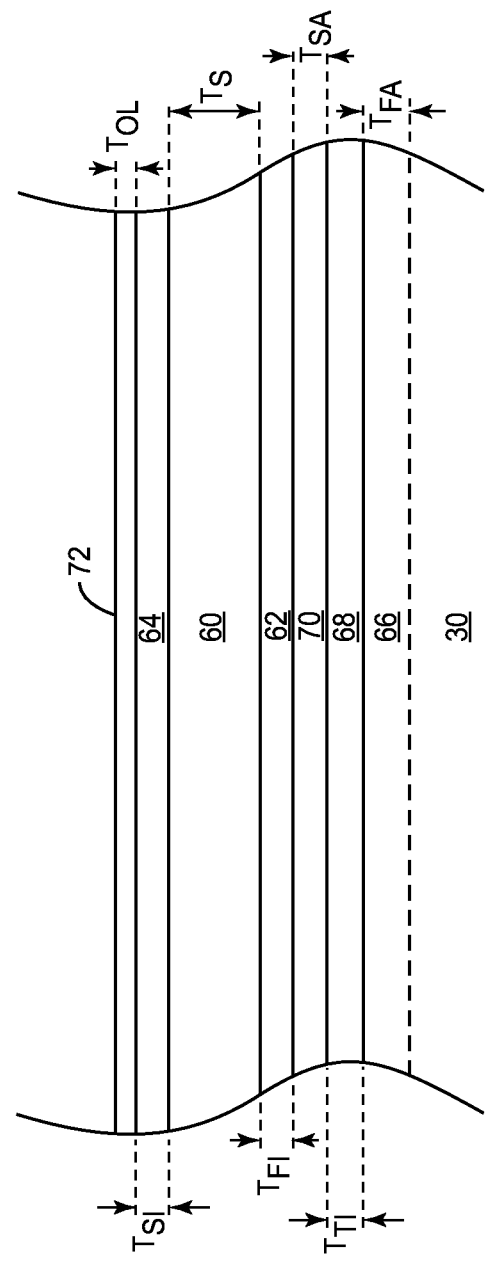

FIG. 9C shows the various layers of the field plate 12 according to yet another embodiment of the present disclosure. The field plate 12 shown in FIG. 9C includes a semiconductor layer 60 between a first refractory metal interposer layer 62 and a second refractory metal interposer layer 64. Further, the field plate 12 includes a first adhesion layer 66 on top of the spacer layer 30, a third refractory metal interposer layer 68 over the first adhesion layer 66, a second adhesion layer 70 over the third refractory metal interposer layer 68 such that the second adhesion layer 70 is between the first refractory metal interposer layer 62 and the third refractory metal interposer layer 68, and a protective overlayer 72 over the second refractory metal interposer layer 64. The first adhesion layer 66 may have a thickness $T_{FA}$ between 50 Å and 150 Å, the third refractory metal interposer layer 68 may have a thickness $T_{TI}$ between 100 Å and 300 Å, the second adhesion layer 70 may have a thickness $T_{SA}$ between 75 Å and 150 Å, the first refractory metal interposer layer 62 may have a thickness $T_{FI}$ between 75 Å and 150 Å, the semiconductor layer 60 may have a thickness $T_S$ between 350 Å and 450 Å, the second refractory metal interposer layer 64 may have a thickness $T_{SI}$ between 75 Å and 150 Å, and the protective overlayer 72 may have a thickness $T_{OL}$ between 75 Å and 125 Å.

In one embodiment, the first adhesion layer 66 is titanium (Ti). The second adhesion layer 70 may be platinum (Pt). The semiconductor layer 60 may be silicon (Si). The protective overlayer 72 may be titanium (Ti) or platinum (Pt) in various embodiments. The first refractory metal interposer layer 62, the second refractory metal interposer layer 64, and the third refractory metal interposer layer 68 may be nickel (Ni), cobalt (Co), titanium (Ti), or combinations of multiple elements such as titanium-tungsten-nitride (TiWN). Because the first refractory metal interposer layer 62, the second refractory metal interposer layer 64, and the third refractory metal interposer layer 68 are resistant to both heat and wear, as discussed above, including these layers in the field plate 12 reduces the electromigration of metals therein. Accordingly, the reliability of the field plate 12 and thus the transistor device 10 is improved. Specifically, by including the first refractory metal interposer layer 62, the second refractory metal interposer layer 64, and the third refractory metal interposer layer 68 in the field plate 12, the likelihood of disconnection and/or shorting of the field plate 12 is significantly reduced.

In one embodiment, the various layers shown in FIG. 9C show the field plate 12 before an annealing process in which the first refractory metal interposer layer 62 and the second refractory metal interposer layer 64 combine with the semiconductor layer 60. In the case that the semiconductor layer 60 is silicon (Si), the resulting combination of layers may be a silicide.

Figure 9D:
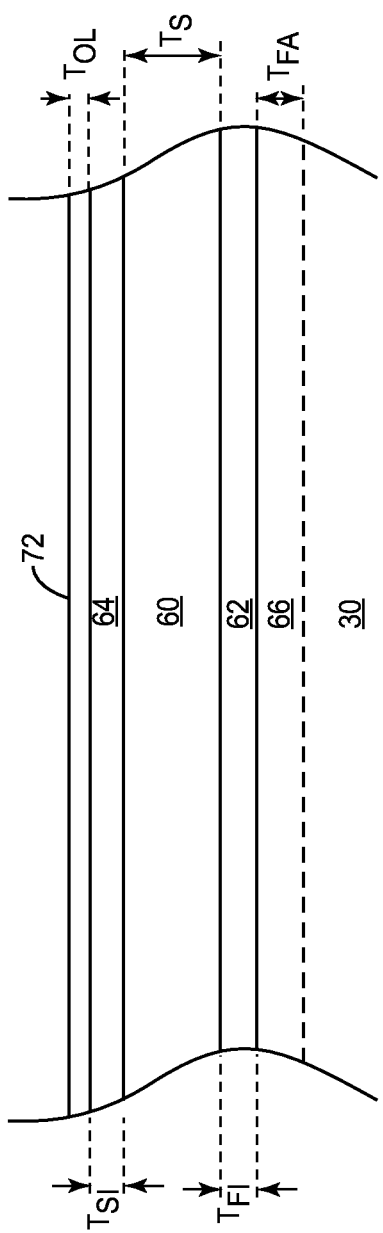

FIG. 9D shows the various layers of the field plate 12 according to yet another embodiment of the present disclosure. The field plate 12 shown in FIG. 9D is substantially similar to that shown in FIG. 9C, except that the field plate 12 shown in FIG. 9D does not include the third refractory metal interposer layer 68 or the second adhesion layer 70. Accordingly, the first refractory metal interposer layer 62 sits directly on top of the first adhesion layer 66. Further, the thicknesses of the various layers shown in FIG. 9D may differ from those discussed above with respect to FIG. 9C. For example, the first adhesion layer 66 may have a thickness $T_{FA}$ between 25 Å and 75 Å, the first refractory metal interposer layer 62 may have a thickness $T_{FI}$ between 50 Å and 150 Å, the semiconductor layer 60 may have a thickness $T_S$ between 350 Å and 450 Å, the second refractory metal interposer layer 64 may have a thickness $T_{SI}$ between 150 Å and 250 Å, and the protective overlayer 72 may have a thickness $T_{OL}$ between 25 Å and 75 Å.

In one embodiment, the various layers shown in FIG. 9C show the field plate 12 before an annealing process in which the first refractory metal interposer layer 62 and the second refractory metal interposer layer 64 combine with the semiconductor layer 60. In the case that the semiconductor layer 60 is silicon (Si), the resulting combination of layers may be a silicide.

Although the various embodiments are discussed above with respect to MESFETs and HEMTs, the disclosure is not so limited. That is, the principles of the present disclosure may be applied to any transistor devices in which a field plate is used. For example, the principles of the present disclosure may be applied to FET devices, metal-oxide semiconductor FET (MOSFET) devices, and the like. Further, while the principles of the present disclosure are primarily directed towards field plates, they may equally be applied to other conductive portions of transistor devices prone to electromigration such as electrodes, conductive traces, and the like.

Figure 9E:
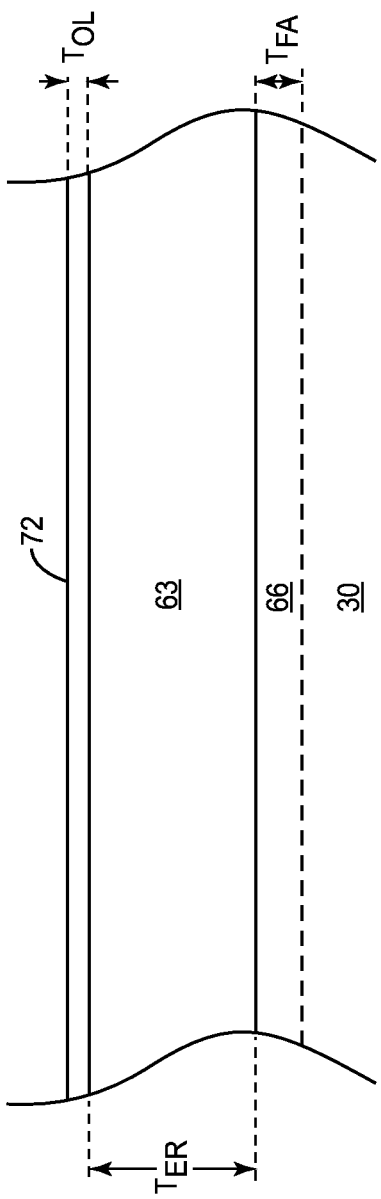
Figure 10:
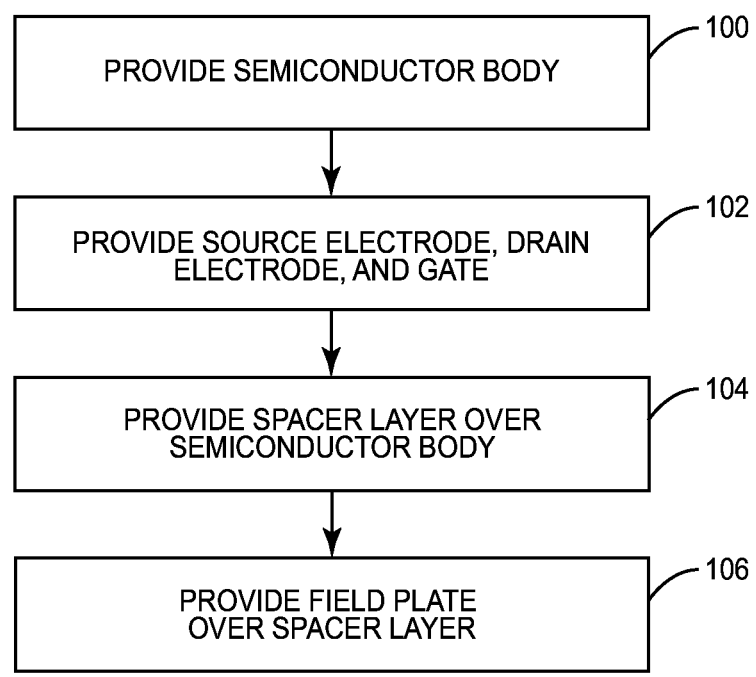
FIG. 10 is a block diagram describing a process for manufacturing a field-effect transistor including a field plate according to one embodiment of the present disclosure.

FIG. 9E shows the various layers of the field plate 12 according to yet another embodiment of the present disclosure. The field plate 12 shown in FIG. 9E is substantially similar to that shown in FIG. 9D, except that the first refractory metal interposer layer 62, the second refractory metal interposer layer 64, and the semiconductor layer 60 are combined into a single electromigration resistant layer 73, for example, by an annealing process. As discussed above, the semiconductor layer 60 may be silicon (Si). Accordingly the electromigration resistant layer 73 may be a silicide layer. A thickness $T_{ER}$ of the electromigration resistant layer 73 may be between 500 Å and 1500 Å. In other embodiments, the first refractory metal interposer layer 62 and the second refractory metal interposer layer 64 may only partially combine with the semiconductor layer 60 such that the layers are still distinct.

FIGS. 10 and 11A through 11D illustrate a generalized process for manufacturing the transistor device 10 according to one embodiment of the present disclosure. First, the semiconductor body 20 is provided (step 100 and FIG. 11A). As discussed above, the semiconductor body 20 may include a number of different layers, each comprised of different materials with different doping levels. Providing each one of the different layers in the semiconductor body 20 may be accomplished via any suitable deposition or growth process. In some embodiments, providing a particular layer of the semiconductor body 20 may include multiple deposition or growth steps.

Figure 11A:
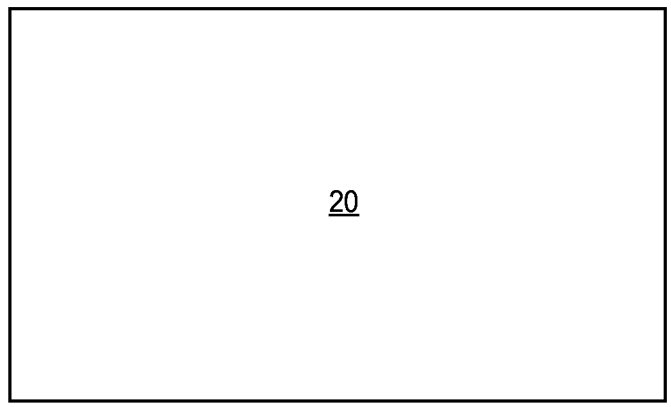
FIGS. 11A through 11D illustrate the process shown in FIG. 10 according to one embodiment of the present disclosure.
Figure 11B:
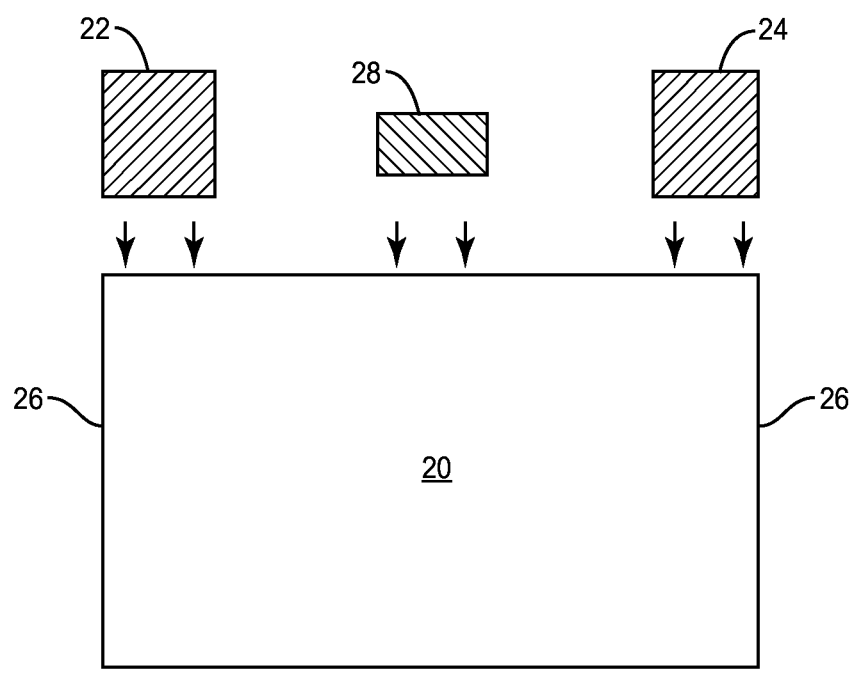

The source electrode 22, the drain electrode 24, and the gate 28 are then provided in electrical contact with one of the layers in the semiconductor body 20, such that the gate 28 is between the source electrode 22 and the drain electrode 24 (step 102 and FIG. 11B). In one embodiment, a surface of the semiconductor body 20 is first etched to provide a number of recesses in which the source electrode, the drain electrode 24, and the gate 28 are respectively provided. Providing the source electrode 22, the drain electrode 24, and the gate 28 may include depositing the source electrode 22, the drain electrode 24, and the gate 28 via any suitable deposition process. For example, the source electrode 22, the drain electrode 24, and the gate 28 may be provided via a sputtering process, an evaporation process, or the like. Further, providing the source electrode 22, the drain electrode 24, and the gate 28 may include separately providing a number of different layers one on top of the other to form the resulting contacts. A mask (not shown) may be applied to appropriately control where the source electrode 22, the drain electrode 24, and the gate 28 are provided in some embodiments. Upon depositing the source electrode 22, the drain electrode 24, and/or the gate 28, the mask (not shown) may then be removed to expose the portions of the semiconductor body 20 between the source electrode 22, the drain electrode 24, and the gate 28.

Figure 11C:
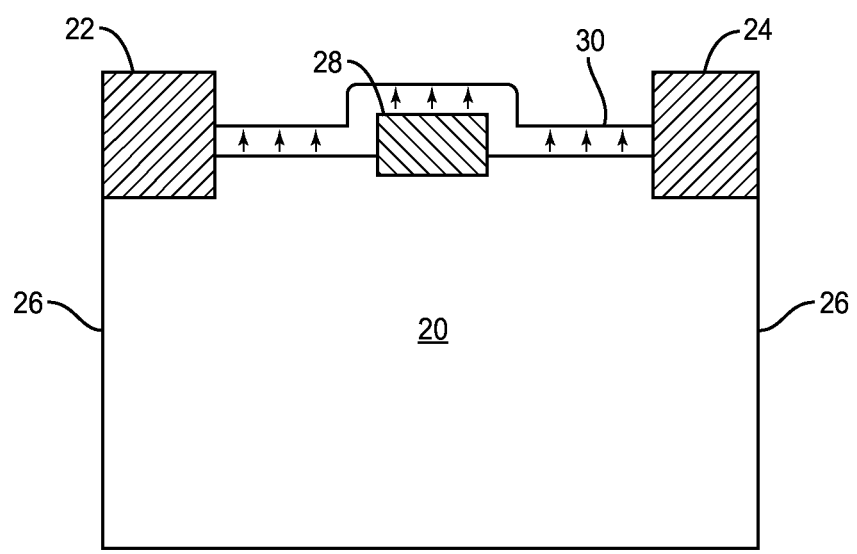

Next, the spacer layer 30 is provided over the exposed portions of the semiconductor body 20 and the gate 28 (step 104 and FIG. 11C). The spacer layer 30 may be provided by either an epitaxial growth process or a deposition process. In some embodiments, the spacer layer 30 is provided before the source electrode 22, the drain electrode 24, and the gate 28, and then etched along with the semiconductor body 20 in order to form the recesses in which the source electrode 22, the drain electrode 24, and the gate 28 are provided. A mask (not shown) may additionally be used to apply the spacer layer 30 to only the necessary portions of the semiconductor body 20 and/or gate 28. For example, the spacer layer 30 may only be provided on the portion of the semiconductor body 20 and/or gate 28 on which the field plate 12 will overlay.

Figure 11D:
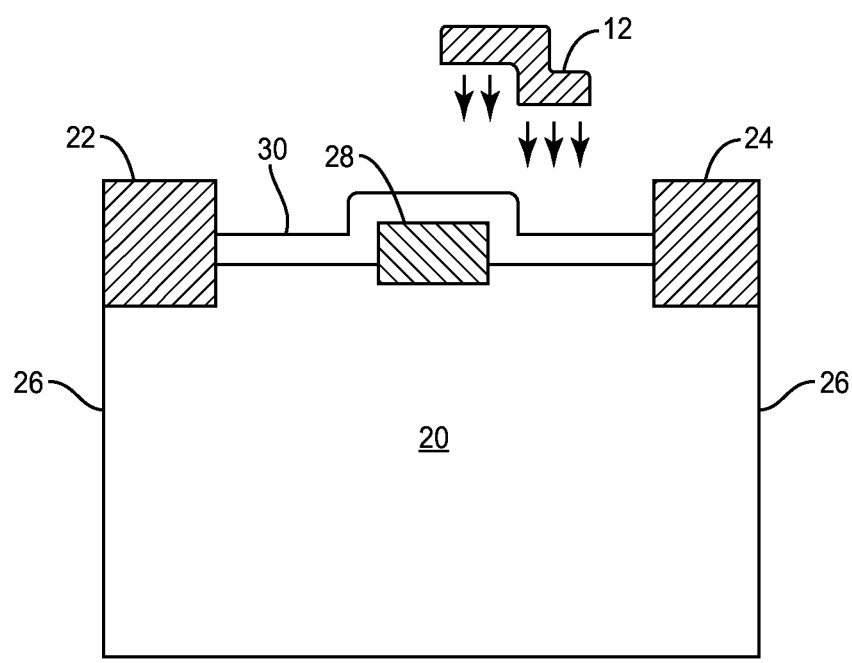
Figure 12:
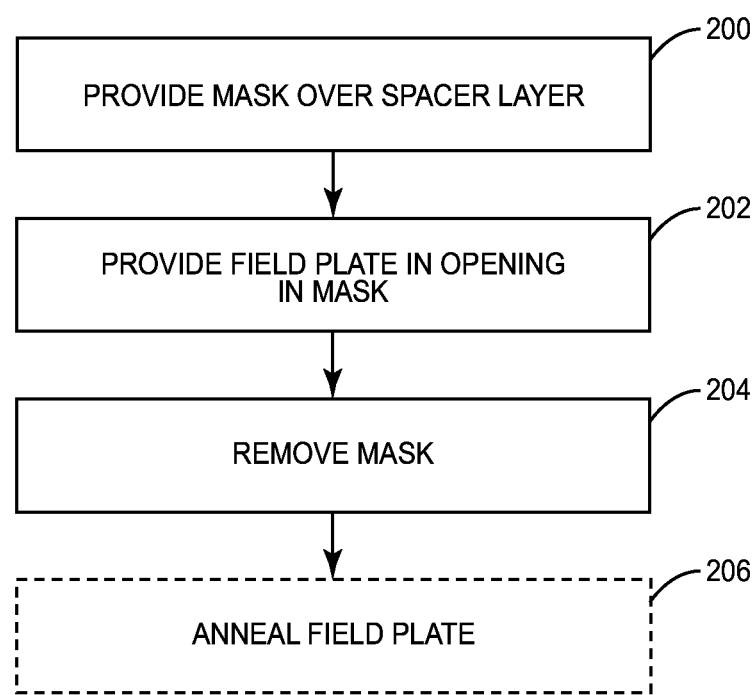
FIG. 12 is a block diagram describing a process for manufacturing a field plate according to one embodiment of the present disclosure.

Finally, the field plate 12 is provided over the spacer layer 30 (step 106 and FIG. 11D). Generally, the field plate is provided by a suitable deposition process such as a sputtering process, an evaporation process, or the like. Providing the field plate 12 may include separately depositing a number of different layers, such as the various layers discussed above with respect to FIG. 9. Further, providing the field plate 12 may include the use of a mask (not shown) to direct the field plate 12 to only a desired portion of the spacer layer 30. When the field plate 12 is provided, the mask (not shown) may then be removed, leaving the device shown in FIG. 11D. In one embodiment, providing the field plate includes an annealing step in which the field plate 12 (and possibly the rest of the transistor device 10) is heated. As discussed above, annealing the field plate 12 may cause mixing or dissolving of one or more layers in the field plate 12, which may lead to a further reduction in the electromigration characteristics thereof. In one embodiment, a passivation layer (not shown) is provided over the source electrode 22, the drain electrode 24, the gate 28, any exposed portions of the semiconductor body 20 and/or the spacer layer 30, and the field plate 12 in order to protect the transistor device 10.

FIGS. 12 and 13A through 13D show details of providing the field plate 12 according to one embodiment of the present disclosure. First, a mask 74 is provided over the source electrode 22, the drain electrode 24, and any exposed portions of the gate 28, the semiconductor body 20, and the spacer layer 30 (step 200 and FIG. 13A). The mask 74 may be pre-patterned with an opening 76 to expose a desired area of the spacer layer 30 on which the field plate 12 is to be located. In other embodiments, the mask 74 may be provided as a blanket layer and then etched to form the opening 76. Generally, the opening 76 corresponds with the desired location of the field plate 12 on the spacer layer 30.

Figure 13A:
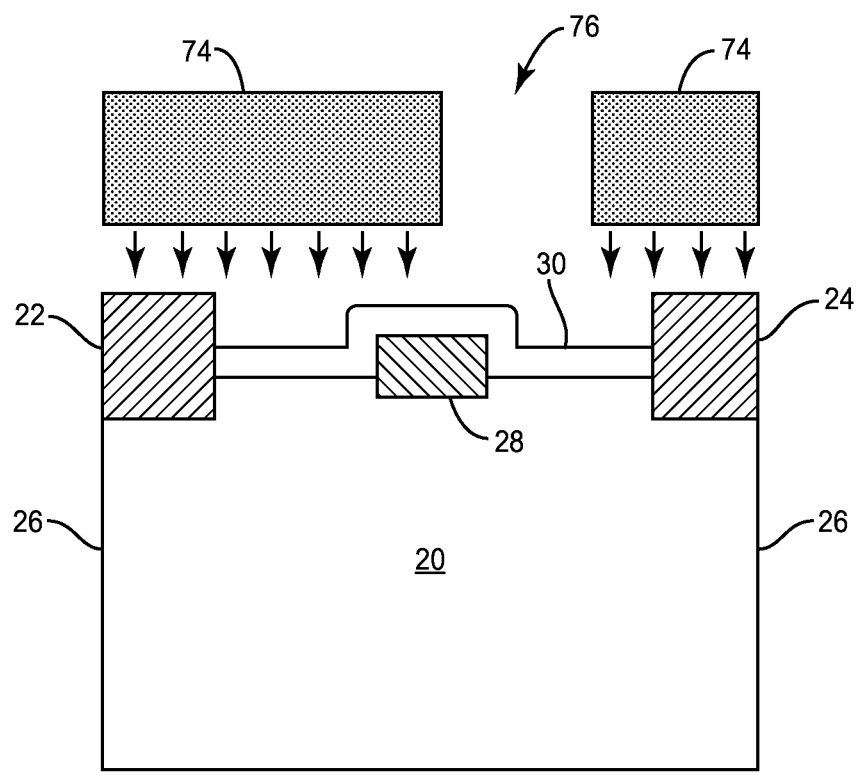
FIGS. 13A through 13D illustrate the process shown in FIG. 12 according to one embodiment of the present disclosure.
Figure 13B:
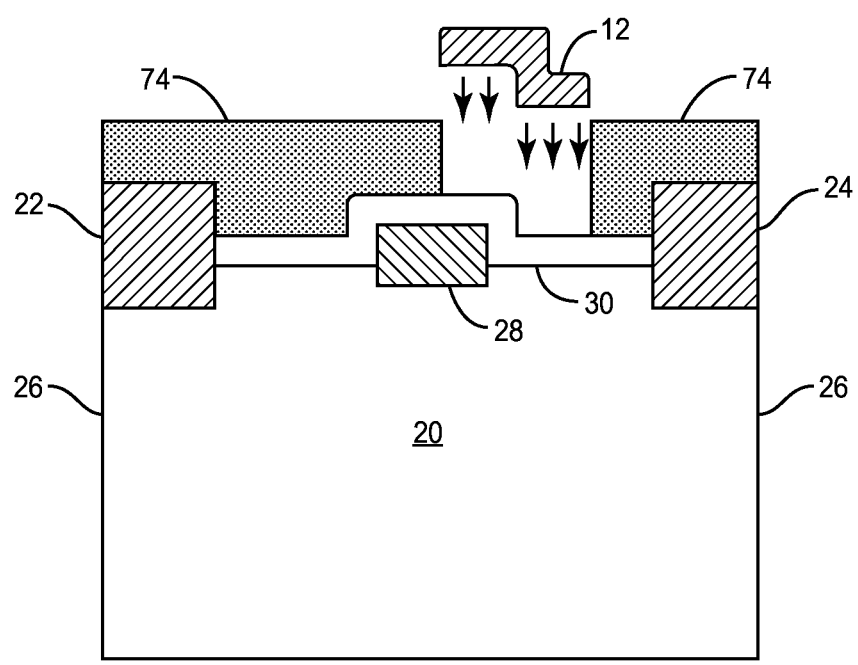
Figure 13C:
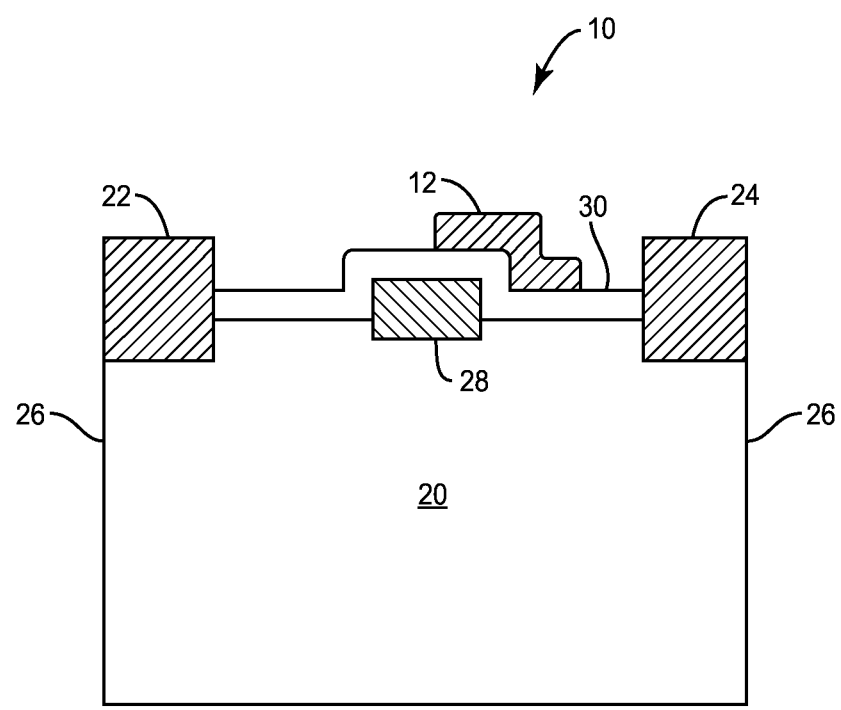
Figure 13D:
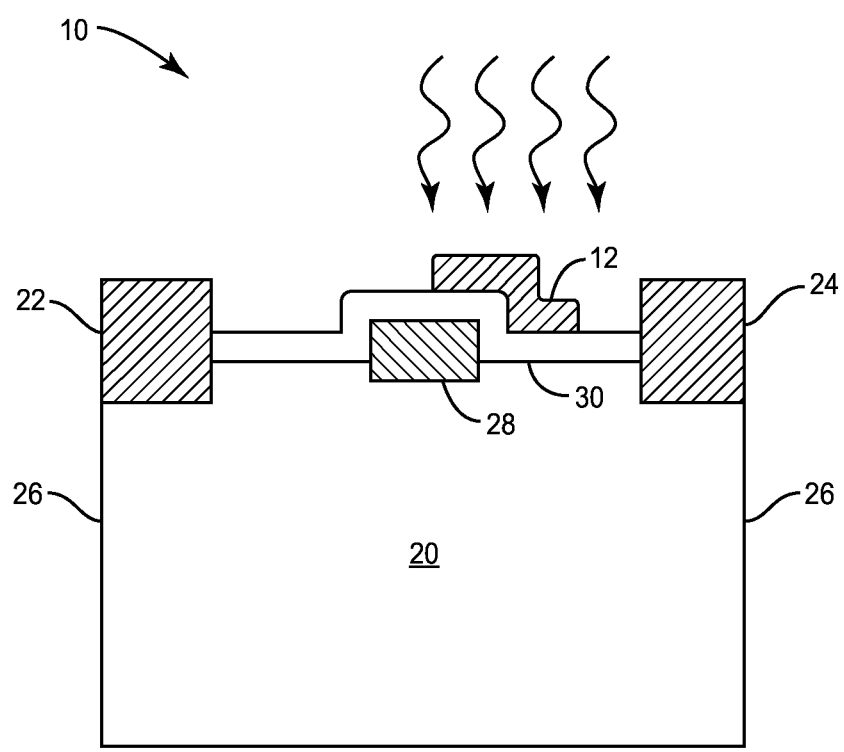

Next, the field plate 12 is provided in the opening 76 of the mask 74 (step 202 and FIG. 13B). Providing the field plate 12 may include providing the field plate via a suitable deposition process such as a sputtering process or an evaporation process. In one embodiment, each layer of the field plate is separately deposited one over the other in the opening 76. The mask 74 is then removed (step 204 and FIG. 13C). The mask 74 may be removed by any suitable process. For example, the mask 74 may be removed by a mechanical polishing process and/or a chemical etching process. Finally, an optional annealing process is performed on the field plate 12 (step 206 and FIG. 13D). In the annealing process, the field plate 12 is exposed to heat (represented by the wavy lines in FIG. 13D). In one embodiment, the field plate 12 is exposed to a temperature of 225° C. for a period of time between 5 and 10 minutes, however, any suitable annealing process may be used without departing from the principles of the present disclosure. The annealing process may cause one or more of the various layers within the field plate 12 to dissolve into one another or otherwise combine. For example, the first refractory metal interposer layer 62 and the second refractory metal interposer layer 64 may combine with the semiconductor layer 60 shown in FIGS. 9C and 9D to form a single electromigration resistant layer 63 as shown in FIG. 9E. In one embodiment, the resulting electromigration resistant layer 63 is a silicide. Due to the various layers of the field plate 12 discussed above, the resulting field plate 12 is resistant to electromigration and therefore much more resilient than its conventional counterparts. Accordingly, the reliability of the resulting transistor device 10 is improved.

Those skilled in the art will recognize improvements and modifications to the preferred embodiments of the present disclosure. All such improvements and modifications are considered within the scope of the concepts disclosed herein and the claims that follow.

What is claimed is:

1. A transistor device comprising:
a semiconductor body;
a spacer layer on at least a portion of the semiconductor body; and
a field plate on at least a portion of the spacer layer, wherein the field plate comprises a semiconductor layer between a first refractory metal interposer layer and a second refractory metal interposer layer,
wherein the first refractory metal interposer layer, the semiconductor layer and the second refractory metal interposer layer each have the same width.

2. The transistor device of claim 1 wherein the semiconductor layer comprises silicon, and wherein the field plate further comprises:
a first adhesion layer on the spacer layer opposite the semiconductor body;
a third refractory metal interposer layer over the first adhesion layer; and
a second adhesion layer between the third refractory metal interposer layer and the first refractory metal interposer layer.

3. The transistor device of claim 2 wherein:
the first refractory metal interposer layer has a thickness between 75 Å and 150 Å;
the second refractory metal interposer layer has a thickness between 75 Å and 150 Å; and
the semiconductor layer has a thickness between 350 Å and 450 Å.

4. The transistor device of claim 3 wherein the first refractory metal interposer layer and the second refractory metal interposer layer comprise nickel.

5. The transistor device of claim 1 wherein the first refractory metal interposer layer and the second refractory metal interposer layer comprise nickel.

6. The transistor device of claim 1 wherein the field plate further comprises:
a first adhesion layer between the spacer layer and the first refractory metal interposer layer; and
a conductive metal protective overlayer over the second refractory metal interposer layer.

7. The transistor device of claim 6 wherein:
the semiconductor layer comprises silicon;
the first refractory metal interposer layer and the second refractory metal interposer layer comprise nickel;
the first adhesion layer comprises titanium; and
the conductive metal protective overlayer comprises titanium.

8. The transistor device of claim 6 wherein:
the first adhesion layer has a thickness between 50 Å and 150 Å thick;
the first refractory metal interposer layer has a thickness between 75 Å and 150 Å;
the semiconductor layer has a thickness between 350 Å and 450 Å;
the second refractory metal interposer layer has a thickness between 75 Å and 150 Å; and
the conductive metal protective overlayer has a thickness between 75 Å and 125 Å.

9. The transistor device of claim 8 wherein:
the semiconductor layer comprises silicon;
the first refractory metal interposer layer and the second refractory metal interposer layer comprise nickel;
the first adhesion layer comprises titanium; and
the conductive metal protective overlayer comprises titanium.

10. The transistor device of claim 1 further comprising a source electrode and a drain electrode in electrical contact with the semiconductor body, wherein the first refractory metal interposer layer, the semiconductor layer and the second refractory metal interposer layer each have the same width along an axis that is extends between the source electrode and the drain electrode.

11. The transistor device of claim 10 further comprising a gate on top of the semiconductor body, wherein the field plate is spaced apart from the gate in a direction parallel to a top surface of the gate so that the field plate does not overlap the gate.

12. The transistor device of claim 11
wherein at least one of the source electrode and the drain electrode includes the same metal structure as the field plate.

13. The transistor device of claim 12 wherein the field plate is electrically connected to the source electrode via a separate conductive path that runs outside an active region of the transistor device.

14. The transistor device of claim 13 wherein a plurality of conductive paths are provided between the field plate and the source electrode.

15. A transistor device comprising:
a semiconductor body;
a spacer layer over at least a portion of the semiconductor body; and
a field plate over at least a portion of the spacer layer, wherein the field plate comprises a semiconductor layer between a first refractory metal interposer layer and a second refractory metal interposer layer,
wherein the field plate further comprises:
a first adhesion layer on the spacer layer opposite the semiconductor body;
a third refractory metal interposer layer over the first adhesion layer;
a second adhesion layer between the third refractory metal interposer layer and the first refractory metal interposer layer; and
a protective overlayer over the second refractory metal interposer layer.

16. The transistor device of claim 15 wherein:
the semiconductor layer comprises silicon;
the first refractory metal interposer layer, the second refractory metal interposer layer, and the third refractory metal interposer layer comprise nickel;
the first adhesion layer comprises titanium;
the second adhesion layer comprises platinum; and
the protective overlayer comprises titanium.

17. The transistor device of claim 15 wherein:
the first adhesion layer has a thickness between 50 Å and 150 Å thick;
the third refractory metal interposer layer has a thickness between 100 Å and 300 Å thick;
the second adhesion layer has a thickness between 75 Å and 150 Å thick;
the first refractory metal interposer layer has a thickness between 75 Å and 150 Å;
the semiconductor layer has a thickness between 350 Å and 450 Å;
the second refractory metal interposer layer has a thickness between 75 Å and 150 Å; and
the protective overlayer has a thickness between 75 Å and 125 Å.

18. The transistor device of claim 17 wherein:
the semiconductor layer comprises silicon;
the first refractory metal interposer layer, the second refractory metal interposer layer, and the third refractory metal interposer layer comprise nickel;
the first adhesion layer comprises titanium;
the second adhesion layer comprises platinum; and
the protective overlayer comprises titanium.

19. The transistor device of claim 15 wherein a separate conductive path between the field plate and the source electrode that runs outside an active region of the transistor device.

20. The transistor device of claim 15, further comprising:
a gate on top of the semiconductor body, wherein the field plate is spaced apart from the gate in a direction parallel to a top surface of the gate so that the field plate does not overlap the gate; and
a source electrode and a drain electrode in electrical contact with the semiconductor body, wherein at least one of the source electrode and the drain electrode includes the same metal structure as the field plate.

21. A method for manufacturing a transistor device comprising:
providing a semiconductor body;
providing a spacer layer over at least a portion of the semiconductor body;
providing a field plate over at least a portion of the spacer layer, wherein providing the field plate comprises providing a semiconductor layer between a first refractory metal interposer layer and a second refractory metal interposer layer; and
annealing the field plate such that the first refractory metal interposer layer, the second refractory metal interposer layer, and the semiconductor layer at least partially combine.

22. The method of claim 21 wherein the first refractory metal interposer layer and the second refractory metal interposer layer comprise nickel.

23. The transistor device of claim 21, wherein the first refractory metal interposer layer, the second refractory metal interposer layer, and the semiconductor layer combine into a single silicide layer as a result of the annealing process.

* * * * *

UNITED STATES PATENT AND TRADEMARK OFFICE
CERTIFICATE OF CORRECTION

PATENT NO. : 9,640,623 B2  
APPLICATION NO. : 14/517185  
DATED : May 2, 2017  
INVENTOR(S) : Hagleitner Page 1 of 1

It is certified that error appears in the above-identified patent and that said Letters Patent is hereby corrected as shown below:

In the Claims

Column 14, Claim 10, Line 8: Please correct "is extends" to read -- extends --

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*